(12) United States Patent
Chou et al.

(10) Patent No.: US 7,814,454 B2
(45) Date of Patent: Oct. 12, 2010

(54) SELECTABLE DEVICE OPTIONS FOR CHARACTERIZING SEMICONDUCTOR DEVICES

(75) Inventors: Anthony I. Chou, Beacon, NY (US); James S. Dunn, Jericho, VT (US); Brian M. Dufrene, Grand Isle, VT (US); Christopher H. Lumbra, Essex Junction, VT (US); Shreesh Narasimha, Beacon, NY (US); Christopher S. Putnam, Hinesburg, VT (US); BethAnn Rainey, Williston, VT (US); Christopher M. Schnabel, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 357 days.

(21) Appl. No.: 11/770,303

(22) Filed: Jun. 28, 2007

(65) Prior Publication Data
US 2009/0007051 A1    Jan. 1, 2009

(51) Int. Cl.
*G06F 17/50* (2006.01)
(52) U.S. Cl. .................. 716/13; 716/2; 716/9; 716/10; 716/14; 716/19; 716/17
(58) Field of Classification Search .............. 716/2, 716/9, 10, 13, 14, 17, 19
See application file for complete search history.

(56) References Cited

U.S. PATENT DOCUMENTS

| | | |
|---|---|---|
| 5,068,603 A | 11/1991 | Mahoney |
| 5,773,856 A | 6/1998 | Bearden et al. |
| 6,047,469 A * | 4/2000 | Luna .......................... 29/830 |
| 6,300,651 B1 | 10/2001 | Kato |
| 6,384,464 B1 | 5/2002 | Shin |

(Continued)

FOREIGN PATENT DOCUMENTS

JP         4256352         9/1992

(Continued)

OTHER PUBLICATIONS

"Investigation on Device Characteristics of MOSFET transistor placed Under Bond Pad for High-Pin-Count SOC Applications", IEEE Transactions on Components and Packaging Technologies, V. 27 #3 p. 452-460.

(Continued)

*Primary Examiner*—Phallaka Kik
(74) *Attorney, Agent, or Firm*—Anthony Canale; Hoffman Warnick LLC (57) ABSTRACT

A system, method and program product that allows multiple devices to be placed between pads such that a Back End Of Line (BEOL) mask change can be used to select different device options. A system is disclosed for implementing a testsite for characterizing devices in an integrated circuit technology, and includes: a system for designing a plurality of device options for a set of chip pads; a system for designing a pseudo wiring layout for each of the plurality of device options; a system for selecting one of the device options; a system for mapping the pseudo wiring layout for a selected device option to a predetermined design level; and a system for outputting a configured mask design at the predetermined design level having a wiring layout mapped for the selected device option.

31 Claims, 6 Drawing Sheets

U.S. PATENT DOCUMENTS

| | | |
|---|---|---|
| 6,631,470 B2 | 10/2003 | Chang et al. |
| 6,727,723 B2 | 4/2004 | Shimizu et al. |
| 6,826,637 B2 | 11/2004 | Chang et al. |
| 6,834,375 B1* | 12/2004 | Stine et al. .................... 716/2 |
| 6,968,525 B2 | 11/2005 | Chang et al. |
| 2003/0057566 A1 | 3/2003 | Huang et al. |
| 2003/0172363 A1 | 9/2003 | Chauhan et al. |
| 2005/0235242 A1 | 10/2005 | Waizumi |
| 2006/0068302 A1* | 3/2006 | Rankin et al. .................. 430/5 |
| 2006/0129962 A1* | 6/2006 | Dinter et al. .................. 716/11 |
| 2006/0190894 A1 | 8/2006 | Jwalant et al. |
| 2006/0195809 A1* | 8/2006 | Cohn et al. ................... 716/10 |
| 2007/0094633 A1* | 4/2007 | Andreev et al. ............... 716/18 |
| 2008/0054404 A1* | 3/2008 | Ueshima .................... 257/536 |

FOREIGN PATENT DOCUMENTS

KR  1020050034013  4/2005

OTHER PUBLICATIONS

"Impedance Terminator For AC Testing Monolithic Chips", R. Bove, E.M. Hubacher and A.D. Savkar International Business Machines Technical Disclosure Bulletin. vol. 15, No. 9, Feb. 1973, p. 2681-2682.

Song, "PCT International Search Report", Application No. PCT/US2008/068452, Oct. 28, 2008, 13 pages.

* cited by examiner

SELECTABLE DEVICE OPTIONS FOR CHARACTERIZING SEMICONDUCTOR DEVICES

FIELD OF THE INVENTION

This disclosure relates generally to characterizing devices to be offered for a semiconductor technology, and more particularly to a system and method of implementing a testsite for characterizing semiconductor devices, which allows a Back End Of Line (BEOL) mask change to be used to select different device options.

BACKGROUND OF THE INVENTION

Each time a new semiconductor technology is introduced, various challenges are presented. A semiconductor technology generally includes substrates and material specification, device specifics, ground rules, critical steps, levels of wiring, and other optional features. Each new technology generation incorporates both evolutionary and revolutionary improvements over the prior generation. Illustrative technologies include the use of deep and shallow trenches, planarization, copper wiring, and silicon-on-insulator (SOI) substrates.

The development of a semiconductor technology requires detailed characterization and optimization of the devices to be offered with the technology. For example, devices such as transistors, capacitors, resistors, diodes, etc., will have different electrical characteristics and properties depending on how they are implemented. For instance, layout differences such as spacing between devices, length of lines, size, etc., will impact device characteristics.

One method for characterizing devices involves the creation of "testsites", which are essentially chips designed in the technology that include a large number of discrete instances of devices connected to pads in metallization which can be probed. A "macro" refers to a set of chip pads having a subset of related devices. For example, a macro may include 25 pads having six versions of transistor, with each transistor having a slight layout variation. The testsite will typically contain as many macros as possible to cover as many devices and device layout options as possible. Once a testsite chip is fabricated, probes can be used to send and receive electrical signals to and from the pads to characterize the discrete devices.

One of the limitations with using testsites is the fact that testsites often do not have enough space (e.g., total number of pads) to contain an inclusive set of all test macro configurations covering all possible device layout options. Accordingly, it is often the case that the testsite does not include all the particular device layout options that may be implemented in the given technology. This can be particularly problematic early in the technology development phase since the final design to be used is not always known.

Rebuilding a completely new testsite, including a complete set of masks, to change a device layout style being used in the current macros can be unacceptable due to cost and schedule. Accordingly, a need exists for a technique that would allow for the ability to cover more layout options in a testsite without significantly impacting cost and schedule.

SUMMARY OF THE INVENTION

The present disclosure addresses the above mentioned problems, as well as others, by providing a system and method that allows for multiple devices to be placed such that a Back End Of Line (BEOL) mask change can be used to select particular device layouts.

In one embodiment, there is a system for implementing a testsite for characterizing devices in an integrated circuit technology, comprising: a system for designing a plurality of device options for a set of chip pads; a system for designing a pseudo wiring layout for each of the plurality of device options; a system for selecting one of the device options; a system for mapping the pseudo wiring layout for a selected device option to a predetermined design level; and a system for outputting a configured mask design at the predetermined design level having a wiring layout mapped for the selected device option.

In a second embodiment, there is a computer program product stored on a computer readable medium for designing a testsite for characterizing devices in an integrated circuit technology, which when executed by a computer system comprises: program code for designing a plurality of device options for a set of chip pads; program code for designing a pseudo wiring layout for each of the plurality of device options; program code for selecting one of the device options; program code for mapping the pseudo wiring layout for a selected device option to a predetermined design level; and program code for outputting a configured mask design at the predetermined design level having a wiring layout mapped for the selected device option.

In a third embodiment, there is a method for implementing a testsite for characterizing devices in an integrated circuit technology, comprising: designing a plurality of device options for a set of chip pads; designing a pseudo wiring layout for each of the plurality of device options; selecting one of the device options; mapping the pseudo wiring layout for a selected device option to a predetermined design level; and outputting a configured mask design at the predetermined design level having a wiring layout mapped for the selected device option.

In a fourth embodiment, there is a system for generating an integrated circuit, comprising: a system for generating a design layout that includes a plurality of device options for a set of chip pads; a system for selecting one of the device options; a system for instantiating a wiring layout for a selected device option within a Back End Of Line (BEOL) design level; and a system for outputting a configured mask design at the BEOL design level that includes the wiring layout for connecting the selected device option to the set of chip pads.

In a fifth embodiment, there is a design structure embodied in a machine readable medium used in a design flow process, the design structure comprising a testsite, the testsite comprising: a plurality of device options for a set of chip pads; and a pseudo wiring layout for each of the plurality of device options.

The illustrative aspects of the present invention are designed to solve the problems herein described and other problems not discussed. Benefits include the ability to cover primary and backup layout options in a testsite without additional macro area; complete coverage of primary and backup layout options being made available on all wafers with different BEOL masks, rather than minimal coverage of each with a single BEOL mask; and the ability to allow macro "overlap" when a testsite is used to cover multiple technology options and device options or layout styles that are different in the multiple technologies.

BRIEF DESCRIPTION OF THE DRAWINGS

These and other features of this invention will be more readily understood from the following detailed description of the various aspects of the invention taken in conjunction with the accompanying drawings.

The drawings are merely schematic representations, not intended to portray specific parameters of the disclosure. The drawings are intended to depict only typical embodiments of the disclosure, and therefore should not be considered as limiting the scope of the disclosure. In the drawings, like numbers represent like elements.

DETAILED DESCRIPTION OF THE INVENTION

As noted above, a testsite is essentially a semiconductor design that includes sets of device layouts, which, when fabricated, can be probed to characterize the device layouts contained within the testsite. A testsite is implemented with a set of masks, which are designed using software tools. Once designed, the masks can be printed, and then be used in a fabrication process to produce a physical testsite chip. The embodiments described herein allow for multiple devices to be placed between pads of a testsite chip such that a Back End Of Line (BEOL) mask change can be used to select different device options.

Note that while in one illustrative embodiment, the BEOL mask change involves instantiating different wiring designs on the metal one (M1) layer, it is understood that the techniques and processes described herein could be applied on any layer (e.g., M2, vias, etc.). Moreover, it is understood that the teachings are not limited to implementing any particular device options, i.e., device options may include any type of device (e.g., transistors, resistors, capacitors, etc.) and any type of layout (e.g., line size, configuration, widths, number of fingers, position, density, etc.).

Figure 1:
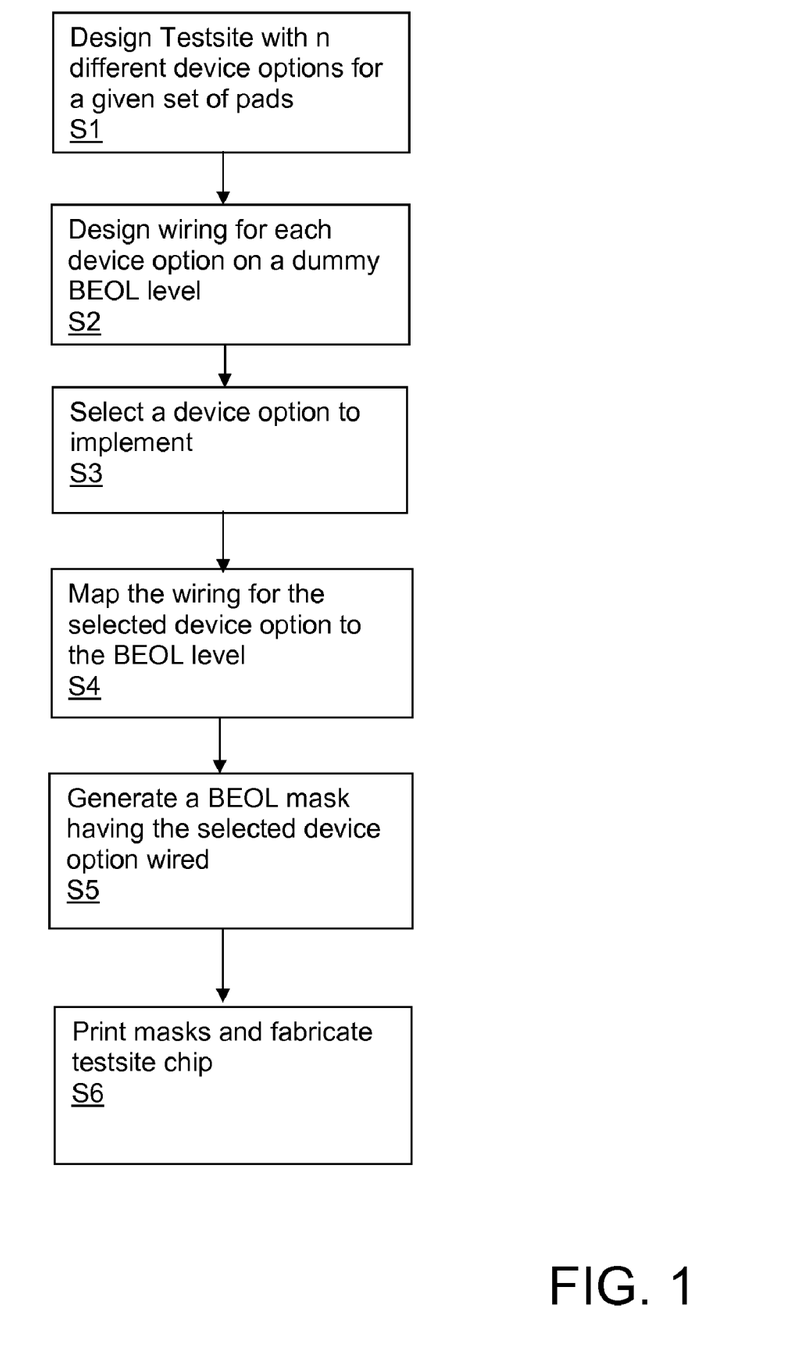
FIG. 1 depicts a flow diagram for allowing multiple devices to be placed between pads such that a Back End Of Line (BEOL) mask change can be used to select different device layouts in accordance with an embodiment of the present disclosure.

FIG. 1 depicts a flow diagram of an illustrative process for providing selectable device layouts in a testsite design. First at S1, a testsite is designed with n different device options for a given set of pads (e.g., a "macro"). In a simple case, e.g., involving the testing of a resistor design in which only two pads are required, there may be three different layout options (i.e., n=3). In this case, three different device options would be designed between the two pads.

In a more complex arrangement, a macro containing 25 pads may be utilized to accommodate six transistor devices (i.e., four pads per device, with one unused pad resulting in six pad sets). Again, n different device options would be designed between each of the six pad sets. For instance, there may be four different device options (i.e., n=4) that potentially need to be tested for each of the six transistor devices in the macro, resulting in a total of 24 different devices.

At S2, a wiring layout is designed for each device option on a "pseudo" Back End Of Line (BEOL) level. In an illustrative embodiment, the wiring for each design option may be designed on different pseudo metal one (M1) layers. For instance, in an application having four design options, wiring can be designed on levels M1_A, M1_B, M1_C and M1_D.

At S3, one of the n device options is selected for implementation. This may, for example, be via a software interface by an end user. At S4, the wiring for the selected device (e.g., on level M1_A) is mapped to the actual BEOL level (e.g., the M1 level). At S5, a BEOL mask is generated having the wiring for the selected device option. Finally, at step S6, the masks are printed and a testsite chip is fabricated. Thus, although the physical chip will actually contain multiple device options, only one of the options will actually be wired. In the event that a different device option is needed, S3-S6 can be repeated with a different device option being selected. Only the BEOL mask needs to be updated to effectuate the desired changes. Accordingly, only a single design level needs to be changed to implement a different device structure.

Figure 2:
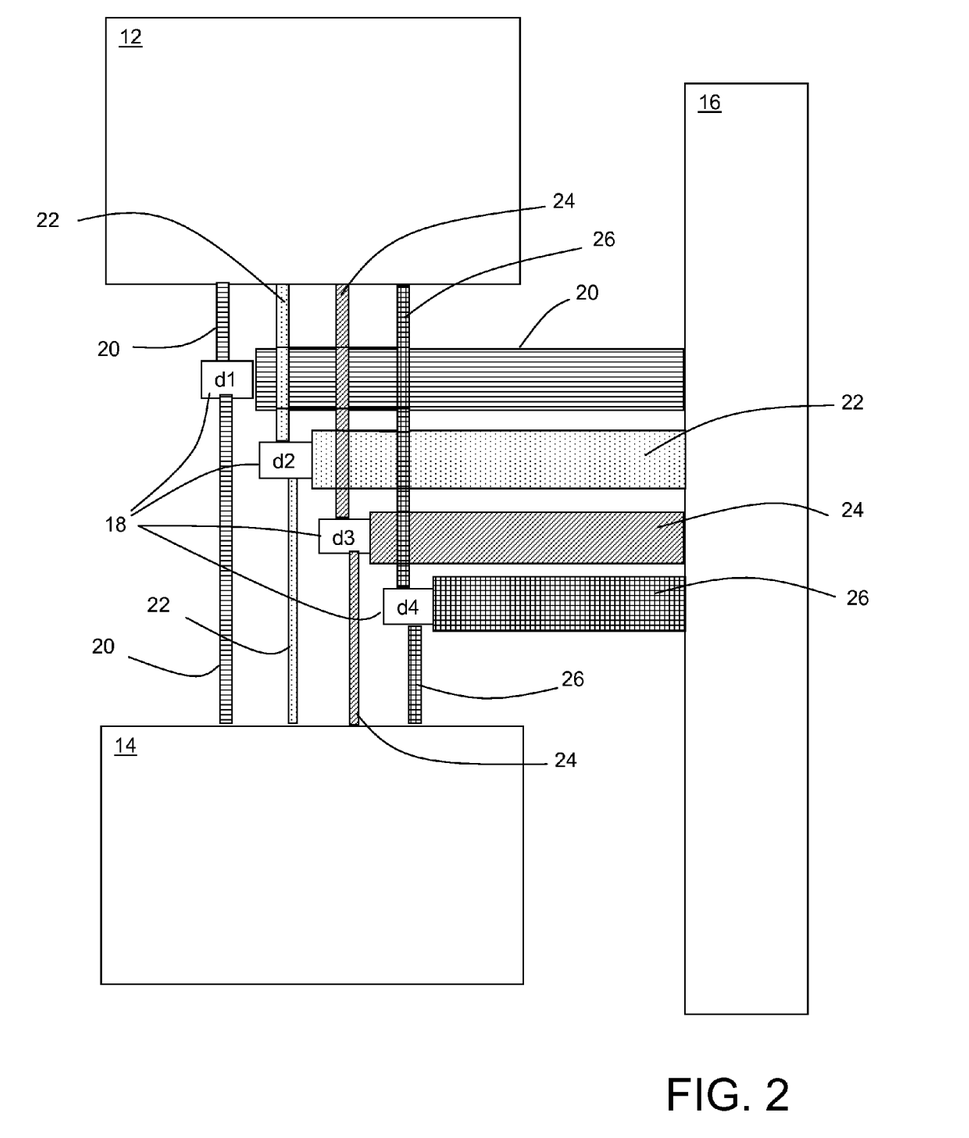
FIG. 2 depicts a layout having a plurality of device options and associated pseudo wiring in accordance with an embodiment of the present disclosure.

FIG. 2 depicts an illustrative portion of a testsite design having pads 12, 14 and 16 at the M1 level. In this example, four device options 18 (d1, d2, d3, d4) have been designed between the pads 12, 14, and 16. In addition, four associated wiring layouts 20, 22, 24 and 26 have been designed on four pseudo levels. For example, wiring layout 20 has been designed for device option d1 on a first pseudo level shown with horizontal line shading, wiring layout 22 has been designed for device option d2 on a second pseudo level shown with dot shading, wiring layout 24 has been designed for device option d3 on a third pseudo level shown with diagonal line shading, and wiring layout 26 has been designed for device option d4 on a fourth pseudo level shown with cross hatching.

Figure 3:
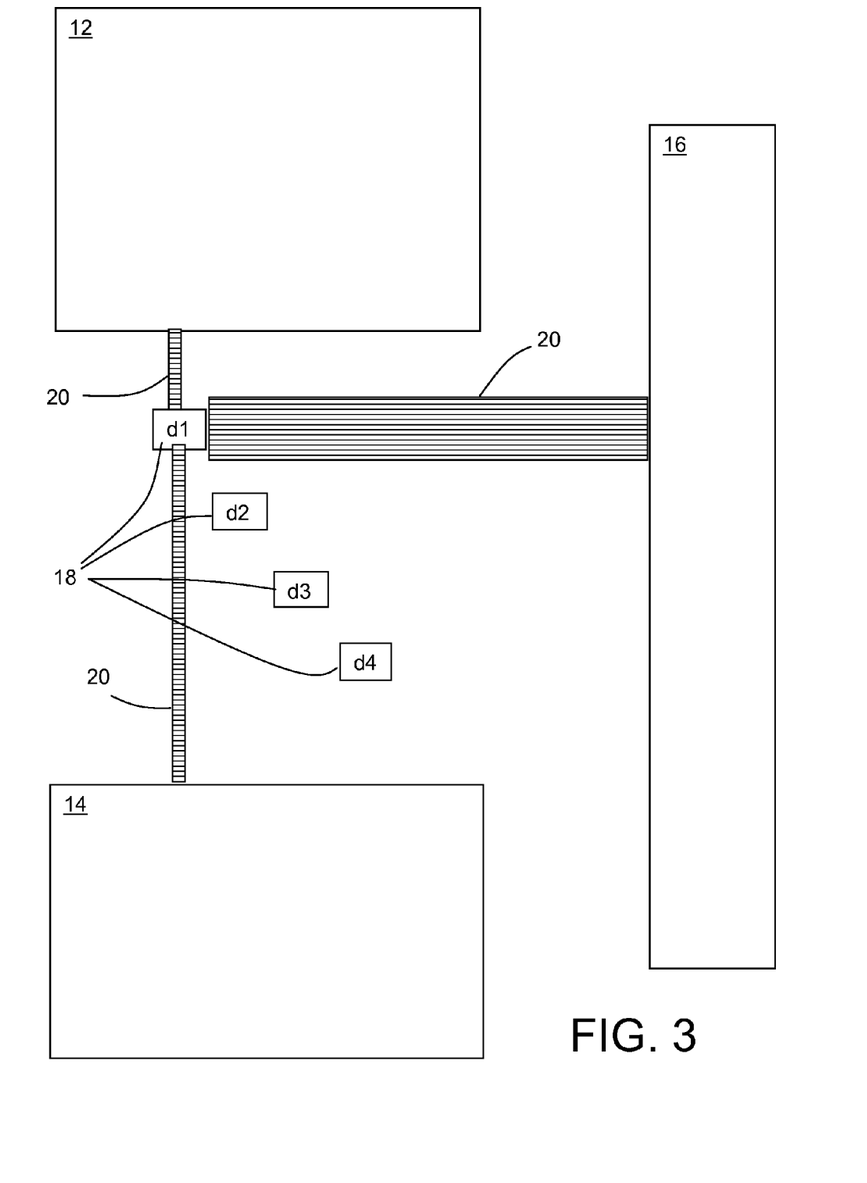
FIG. 3 depicts a layout having a plurality of device options and a mapped wiring for a selected device option in accordance with an embodiment of the present disclosure.

FIG. 3 depicts the design result after device option d1 was selected for implementation. In this case, wiring layout 20 is mapped to the M1 level, where it will be included in the actual M1 mask.

Figure 4:
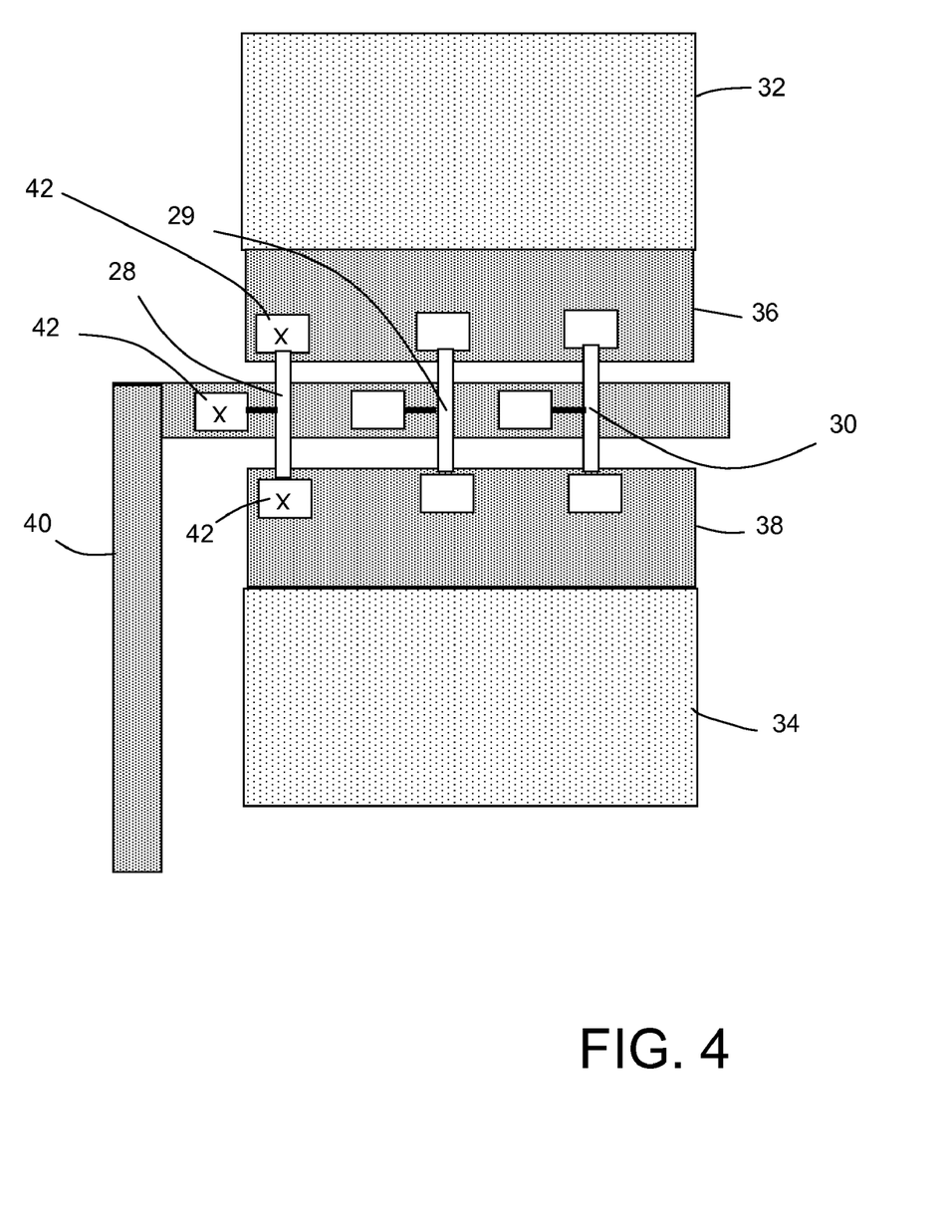
FIG. 4 depicts an alternative embodiment using vias in accordance with an embodiment of the present disclosure.

FIG. 4 depicts an alternative embodiment in which three device options 28, 29, and 30 are provided between source and drain pads 32 and 34, and gate line 40. In this case, vias 42 (shown with X's) are utilized to wire the selected device option 28 to associated regions 36, 38 and 40, to ultimately provide connection to pads 32 and 34, and line 40. In this case, device 28 has been selected for wiring.

Figure 5:
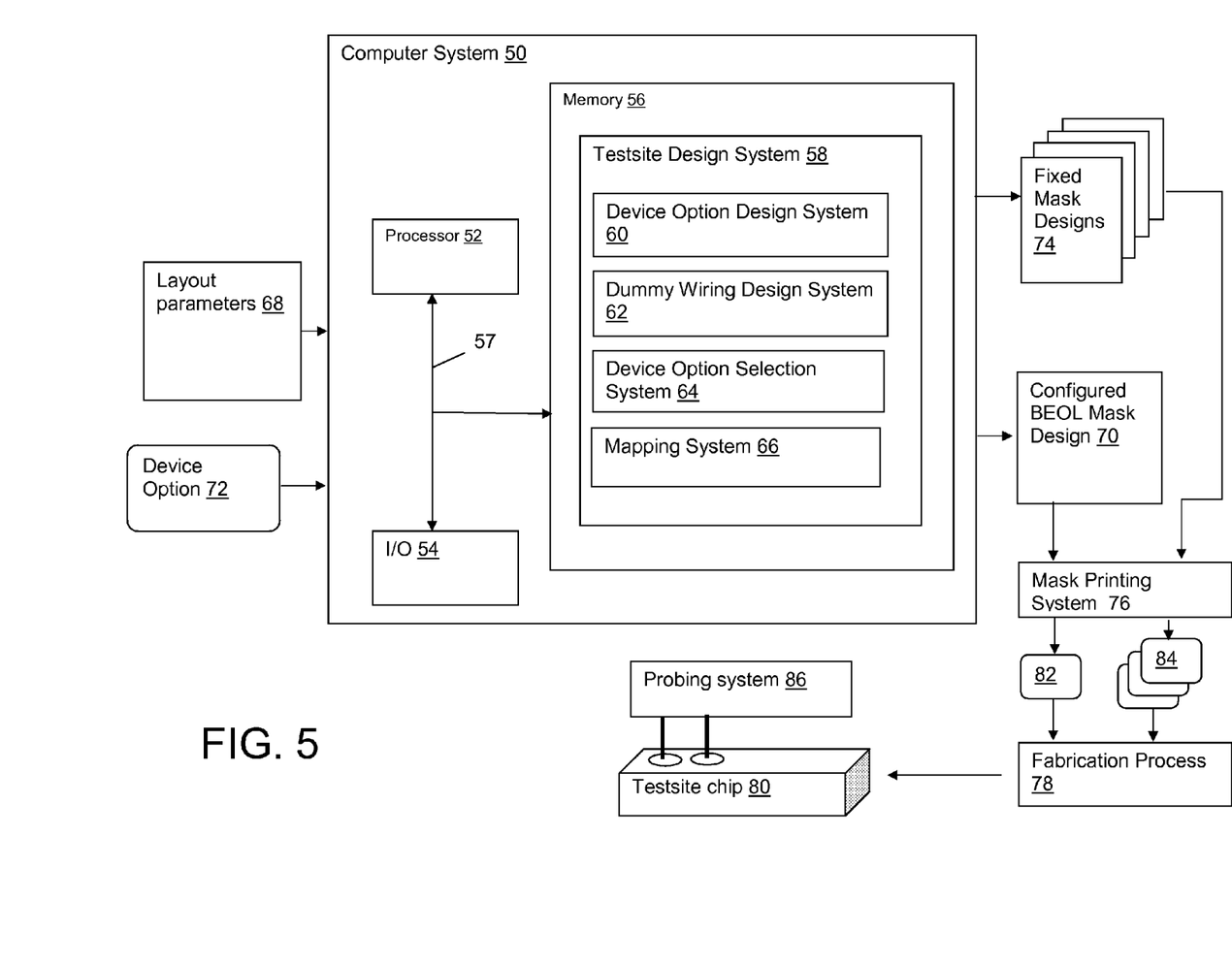
FIG. 5 depicts a computer system having a testsite design system in accordance with an embodiment of the present disclosure.

FIG. 5 depicts a computer system 50 having a testsite design system 58 implemented as a software program product in memory 56 for generating a set of fixed mask designs 74 and a configured BEOL mask design 70. Once created, the fixed mask designs 74 and configured BEOL mask design 70 can be printed into physical masks 82, 84 by mask printing system 76, and then used by fabrication process 78 to fabricate a testsite chip 78. Fixed mask designs 74 are utilized to generate a set of fixed masks 84 to implement all of the layout features for fabricating testsite chip 80, with the exception of one BEOL level that is implemented by a BEOL mask 84 printed from configurable BEOL mask design 70.

Fixed mask designs 74 may be created based on layout parameters 68 using known design techniques and tools within testsite design system 58. Configured BEOL mask design 70 is generated using an additional set of software tools, shown in this illustrative embodiment as: device option design system 60, pseudo wiring design system 62, device option selection system 64 and mapping system 66. Device option design system 60 provides a process for providing a set of device options in a given region between a set of pads (e.g., devices d1, d2, d3 and d4 of FIG. 2). Pseudo wiring design system 62 provides a process for designing a pseudo wiring design for each of the device options. Device option selection system 64 provides a process for selecting a device option 72 from the set of device options. Mapping system 66 maps the pseudo wiring associated with the selected device option 72 to the BEOL layer, e.g., the M1 layer. Once the wiring for the selected device option 72 is mapped, configured BEOL mask design 70 can be used to create BEOL mask 82, which is then used in a BEOL fabrication step in building testsite chip 80. Once fabricated, probing system 86 can be used to probe chip pads to characterize the selected device options.

In the event that device options provided in the configurable BEOL mask design 70 need to be changed, an alternative device option 72 can be inputted into device option selection system 64 and cause mapping system 66 to instantiate a different device option selected from the layout created by device option design system 60. A new configured BEOL mask design 70 can then be used to generate a different BEOL mask 82 for fabrication process 78. Thus, no changes need to be made to each of the fixed masks 84 to instantiate different device options.

It is understood that computer system 50 may be implemented as any type of computing infrastructure. Computer system 50 generally includes a processor 52, input/output (I/O) 54, memory 56, and bus 57. The processor 52 may comprise a single processing unit, or be distributed across one or more processing units in one or more locations, e.g., on a client and server. Memory 56 may comprise any known type of data storage and/or transmission media, including magnetic media, optical media, random access memory (RAM), read-only memory (ROM), a data cache, a data object, etc. Moreover, memory 56 may reside at a single physical location, comprising one or more types of data storage, or be distributed across a plurality of physical systems in various forms.

I/O 54 may comprise any system for exchanging information to/from an external resource. External devices/resources may comprise any known type of external device, including a monitor/display, speakers, storage, another computer system, a hand-held device, keyboard, mouse, voice recognition system, speech output system, printer, facsimile, pager, etc. Bus 57 provides a communication link between each of the components in the computer system 50 and likewise may comprise any known type of transmission link, including electrical, optical, wireless, etc. Although not shown, additional components, such as cache memory, communication systems, system software, etc., may be incorporated into computer system 50.

Access to computer system 50 may be provided over a network such as the Internet, a local area network (LAN), a wide area network (WAN), a virtual private network (VPN), etc. Communication could occur via a direct hardwired connection (e.g., serial port), or via an addressable connection that may utilize any combination of wireline and/or wireless transmission methods. Moreover, conventional network connectivity, such as Token Ring, Ethernet, WiFi or other conventional communications standards could be used. Still yet, connectivity could be provided by conventional TCP/IP sockets-based protocol. In this instance, an Internet service provider could be used to establish interconnectivity. Further, as indicated above, communication could occur in a client-server or server-server environment.

It should be appreciated that the teachings of the present invention could be offered as a business method on a subscription or fee basis. For example, a computer system 50 comprising a testsite design system 58 could be created, maintained and/or deployed by a service provider that offers the functions described herein for customers. That is, a service provider could offer to deploy or provide the ability to generate configurable BEOL mask designs 70 as described above.

It is understood that in addition to being implemented as a system and method, the features may be provided as a program product stored on a computer-readable medium, which when executed, enables computer system 50 to provide a testsite design system 58. To this extent, the computer-readable medium may include program code, which implements the processes and systems described herein. It is understood that the term "computer-readable medium" comprises one or more of any type of physical embodiment of the program code. In particular, the computer-readable medium can comprise program code embodied on one or more portable storage articles of manufacture (e.g., a compact disc, a magnetic disk, a tape, etc.), on one or more data storage portions of a computing device, such as memory 56 and/or a storage system, and/or as a data signal traveling over a network (e.g., during a wired/wireless electronic distribution of the program product).

As used herein, it is understood that the terms "program product," "program code" and "computer program code" are synonymous and mean any expression, in any language, code or notation, of a set of instructions that cause a computing device having an information processing capability to perform a particular function either directly or after any combination of the following: (a) conversion to another language, code or notation; (b) reproduction in a different material form; and/or (c) decompression. To this extent, program code can be embodied as one or more types of program products, such as an application/software program, component software/a library of functions, an operating system, a basic I/O system/driver for a particular computing and/or I/O device, and the like. Further, it is understood that terms such as "component" and "system" are synonymous as used herein and represent any combination of hardware and/or software capable of performing some function(s).

The block diagrams in the figures illustrate the architecture, functionality, and operation of possible implementations of systems, methods and computer program products according to various embodiments of the present invention. In this regard, each block in the block diagrams may represent a module, segment, or portion of code, which comprises one or more executable instructions for implementing the specified logical function(s). It should also be noted that the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams can be implemented by special purpose hardware-based systems which perform the specified functions or acts, or combinations of special purpose hardware and computer instructions.

Figure 6:
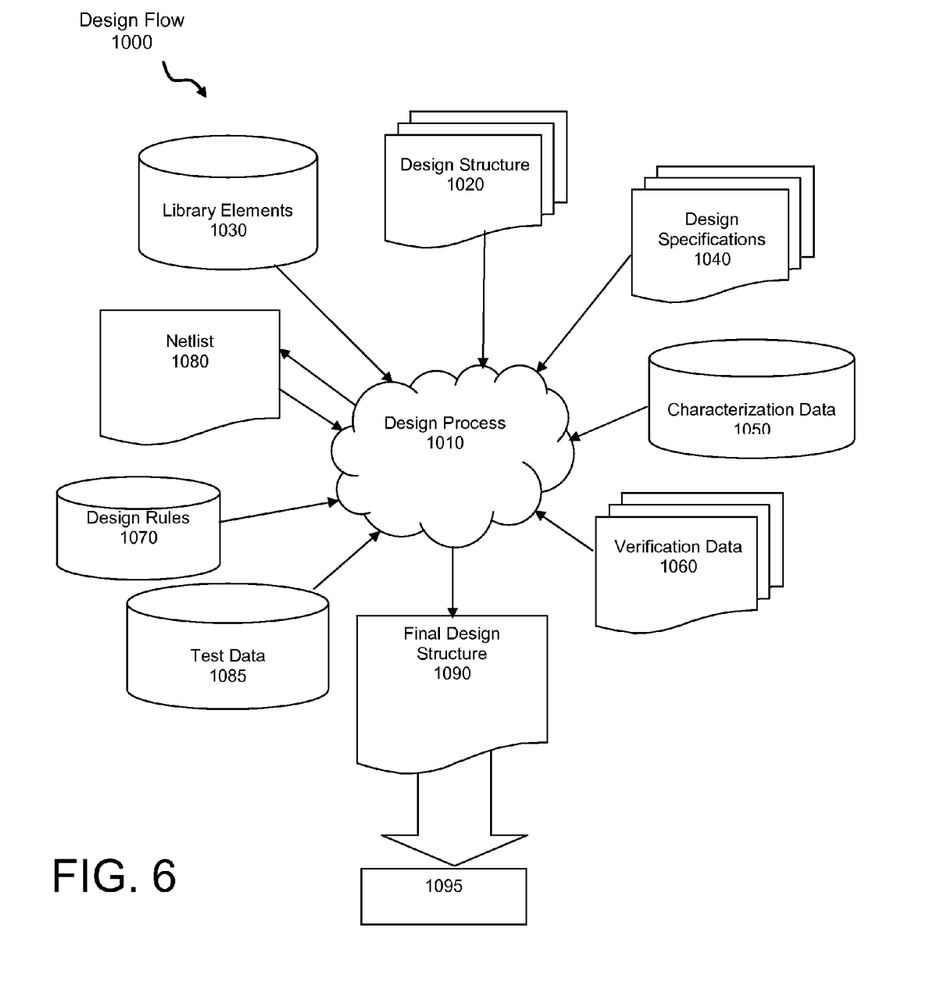
FIG. 6 depicts a design flow in accordance with an embodiment of the present disclosure.

FIG. 6 shows a block diagram of an example design flow 1000. Design flow 1000 may vary depending on the type of IC being designed. For example, a design flow 1000 for building an application specific IC (ASIC) will differ from a design flow 1000 for designing a standard component. Design structure 1020 is an input to a design process 1010 and may come from an IP provider, a core developer, or other design company. Design structure 1020 comprises a circuit, such as that shown in FIGS. 2-4, in the form of schematics or HDL, a hardware-description language, (e.g., Verilog, VHDL, C, etc.). Design structure 1020 may be on one or more of a machine readable medium such as that described herein. For example, design structure 1020 may be a text file or a graphical representation of a circuit. Design process 1010 synthesizes (or translates) the circuit into a netlist 1080, where netlist 1080 is, for example, a list of fat wires, transistors, logic gates, control circuits, I/O, models, etc. and describes the connections to other elements and circuits in an integrated circuit design and recorded on at least one of a machine readable medium.

Design process 1010 includes using a variety of inputs; for example, inputs from library elements 1030 which may house a set of commonly used elements, circuits, and devices, including models, layouts, and symbolic representations, for a given manufacturing technology (e.g. different technology nodes, 32 nm, 45 nm, 90 nm, etc.), design specifications 1040, characterization data 1050, verification data 1060, design rules 1070, and test data files 1085, which may include test patterns and other testing information. Design process 1010 further includes, for example, standard circuit design processes such as timing analysis, verification tools, design rule checkers, place and route tools, etc. One of ordinary skill in the art of integrated circuit design can appreciate the extent of possible electronic design automation tools and applications used in design process 1010 without deviating from the scope and spirit of the invention.

Ultimately, design process 1010 translates a circuit, along with the rest of the integrated circuit design (if applicable), into a final design structure 1090 (e.g., information stored in a GDS storage medium). Final design structure 1090 may comprise information such as, for example, test data files, design content files, manufacturing data, layout parameters, wires, levels of metal, vias, shapes, test data, data for routing through the manufacturing line, and any other data required by a semiconductor manufacturer to produce a circuit such as that shown in FIGS. 2-4. Final design structure 1090 may then proceed to a stage 1095 of design flow 1000; where stage 1095 is, for example, where final design structure 1090 proceeds to tape-out, is released to manufacturing, is sent to another design house or is sent back to the customer.

Although specific embodiments have been illustrated and described herein, those of ordinary skill in the art appreciate that any arrangement which is calculated to achieve the same purpose may be substituted for the specific embodiments shown and that the invention has other applications in other environments. This application is intended to cover any adaptations or variations of the present invention. The following claims are in no way intended to limit the scope of the invention to the specific embodiments described herein.

What is claimed is:

1. A system for implementing a testsite for characterizing devices in an integrated circuit technology, comprising:
   a system for designing a plurality of device options for a set of chip pads;
   a system for designing a pseudo wiring layout for each of the plurality of device options, wherein each pseudo wiring layout is on a different pseudo metal layer;
   a system for selecting one of the device options;
   a system for mapping the pseudo wiring layout for a selected device option to a predetermined design level; and
   a system for outputting a configured Back End of Line (BEOL) mask design at the predetermined design level having a wiring layout mapped for the selected device option.

2. The system of claim 1, wherein the predetermined design level comprises a metal one (M1) layer.

3. The system of claim 1, further comprising a system for generating a plurality of fixed mask designs that includes the plurality of device options.

4. The system of claim 3, further comprising a system for printing the plurality of fixed mask designs and configured mask design into a plurality of fixed masks and a configured mask, respectfully.

5. The system of claim 4, wherein the plurality of fixed masks and the configured mask are utilized to fabricate a testsite chip that includes the plurality of device options, and wherein only the selected device option is wired to the set of chip pads.

6. The system of claim 1, wherein the wiring layout comprises vias to connect the selected device option to the set of chip pads.

7. The system of claim 1, wherein the plurality of device options include a first device option specific to a first technology and a second device option specific to a second technology.

8. A computer program product stored on a non-transitory computer readable medium, which when executed, enables a computer system to implement a testsite method for characterizing devices in an integrated circuit technology, the method comprising:
   designing a plurality of device options for a set of chip pads;
   designing a pseudo wiring layout for each of the plurality of device options, wherein each pseudo wiring layout is on a different pseudo metal layer;
   selecting one of the device options;
   mapping the pseudo wiring layout for a selected device option to a predetermined design level; and
   outputting a configured Back End of Line (BEOL) mask design at the predetermined design level having a wiring layout mapped for the selected device option.

9. The computer program product of claim 8, wherein the predetermined design level comprises a layer selected from the group consisting of a metal one (M1) layer and a metal two (M2) layer.

10. The computer program product of claim 8, further comprising generating a plurality of fixed mask designs that includes the plurality of device options.

11. The computer program product of claim 8, wherein the plurality of device options include a first device option specific to a first technology and a second device option specific to a second technology.

12. The computer program product of claim 8, wherein the wiring layout comprises vias to connect the selected device option to the set of chip pads.

13. A method for implementing a testsite for characterizing devices in an integrated circuit technology, comprising:
   designing a plurality of device options for a set of chip pads;
   designing a pseudo wiring layout for each of the plurality of device options, wherein each pseudo wiring layout is on a different pseudo metal layer;
   selecting one of the device options;
   mapping the pseudo wiring layout for a selected device option to a predetermined design level; and outputting, by at least one computing device, a configured Back End of Line (BEOL) mask design at the predetermined design level having a wiring layout mapped for the selected device option.

14. The method of claim 13, wherein the predetermined design level comprises a metal one (M1) layer.

15. The method of claim 13, further comprising generating a plurality of fixed mask designs that includes the plurality of device options.

16. The method of claim 15, further comprising printing the plurality of fixed mask designs and configured mask design into a plurality of fixed masks and a configured mask, respectfully.

17. The method of claim 16, further comprising using the plurality of fixed masks and the configured mask to fabricate a testsite chip that includes the plurality of device options, and wherein only the selected device option is wired to the set of chip pads.

18. The method of claim 17, further comprising:
selecting an alternative device option;
mapping the pseudo wiring layout for the alternative device option to the predetermined design level;
outputting an alternative configured mask design at the predetermined design level having the wiring layout mapped for the alternative device option;
printing the alternative configured mask design into an alternative configured mask; and
using the plurality of fixed masks and the alternative configured mask to fabricate an alternative testsite chip that includes the plurality of device options, wherein only the alternative device option is wired to the set of chip pads.

19. The method of claim 13, wherein the wiring layout comprises vias to connect the selected device option to the set of chip pads.

20. The method of claim 13, wherein the plurality of device options include a first device option specific to a first technology and a second device option specific to a second technology.

21. A system for generating an integrated circuit, comprising:
a system for generating a design layout that includes a plurality of device options for a set of chip pads;
a system for designing a pseudo wiring layout for each of the plurality of device options, wherein each pseudo wiring layout is on a different pseudo metal layer;
a system for selecting one of the device options;
a system for instantiating a wiring layout for a selected device option within a Back End Of Line (BEOL) design level; and
a system for outputting a configured BEOL mask design at the BEOL design level that includes the wiring layout for connecting the selected device option to the set of chip pads.

22. The system of claim 21, wherein the wiring layout for the selected device resides at a metal one (M1) layer, a metal two (M2) layer, or a via layer.

23. The system of claim 21, further comprising a system for generating a set of fixed mask designs that include the plurality of device options.

24. The system of claim 23, further comprising a system for printing the set of fixed mask designs and the configured mask design to generate a set of fixed masks and a configured mask, respectfully.

25. The system of claim 24, further comprising a system for fabricating an integrated circuit using the set of fixed masks and configured mask.

26. The system of claim 25, wherein the integrated circuit comprises a testsite.

27. The system of claim 26, further comprising a system for probing the set of chip pads to characterize the selected device option.

28. A design structure embodied in a non-transitory computer readable medium used in a design flow process executed on at least one computing device, the design structure comprising a testsite for characterizing devices in an integrated circuit technology, the testsite comprising:
a plurality of device options for a set of chip pads; and
a pseudo wiring layout for each of the plurality of device options, wherein each pseudo wiring layout is on a different pseudo metal layer.

29. The design structure of claim 28, wherein the design structure comprises a netlist which describes the testsite.

30. The design structure of claim 28, wherein the design structure resides on a GDS storage medium.

31. The design structure of claim 28, wherein the design structure includes test data files, characterization data, verification data, or design specifications.

* * * * *